(12) United States Patent
Wu

(10) Patent No.: US 7,492,636 B2
(45) Date of Patent: Feb. 17, 2009

(54) METHODS FOR CONDUCTING DOUBLE-SIDE-BIASING OPERATIONS OF NAND MEMORY ARRAYS

(75) Inventor: Chao-I Wu, Zhubei (TW)

(73) Assignee: Macronix International Co., Ltd., Hsinchu (TW)

(*) Notice: Subject to any disclaimer, the term of this patent is extended or adjusted under 35 U.S.C. 154(b) by 143 days.

(21) Appl. No.: 11/741,059

(22) Filed: Apr. 27, 2007

(65) Prior Publication Data

US 2008/0266980 A1  Oct. 30, 2008

(51) Int. Cl.
   *G11C 11/34* (2006.01)
(52) U.S. Cl. .............................. 365/185.17; 365/185.03
(58) Field of Classification Search .......... 365/185.17, 365/185.03, 185.27
   See application file for complete search history.

(56) References Cited

U.S. PATENT DOCUMENTS

| 6,011,725 | A | 1/2000 | Eitan et al. |
| 6,181,597 | B1* | 1/2001 | Nachumovsky ........ 365/185.03 |
| 6,670,669 | B1* | 12/2003 | Kawamura ................. 257/314 |
| 7,075,146 | B2* | 7/2006 | Forbes ....................... 257/330 |
| 7,200,045 | B2* | 4/2007 | Lue et al. ................ 365/185.28 |

OTHER PUBLICATIONS

Yeh, C.C., et al., "Phines: A Novel Low Power Program/Erase, Small Pitch, 2-Bit per Cell Flash Memory," IEDM Tech. Dig. 2002, 931-934.
Ito et al., "A Novel MNOS Techology Using Gate Hole Injection in Erase Operation for Embedded Nonvolatile Memory Applications," 2004 Symp. on VLSI Tech Digest of Tech Papers 2004, 80-81.

* cited by examiner

*Primary Examiner*—Anh Phung
(74) *Attorney, Agent, or Firm*—Haynes Beffel & Wolfeld LLP

(57) ABSTRACT

Methods are described for double-side-biasing of a NAND memory array device comprising a plurality of charge trapping memory cells for programming and erasing the NAND memory array device. A double-side-biasing method applies a bias voltage simultaneously on a first junction (a source region) and a second junction (a drain region) so that a left bit and a right bit in a charge trapping memory cell can be programmed in parallel or erased in parallel. Random (or selective) bit program and random (or selective) bit erase can be achieved by using a double-side-biasing method on a NAND memory array device for both data and code application. A first type of double-side-biasing method is to program the NAND array with a double-side-bias electron injection. A second type of double-side-biasing method is to erase the NAND array with a double-side-bias hole injection.

18 Claims, 13 Drawing Sheets

METHODS FOR CONDUCTING DOUBLE-SIDE-BIASING OPERATIONS OF NAND MEMORY ARRAYS

BACKGROUND OF THE INVENTION

1. Field of the Invention

The present invention relates generally to electrically programmable and erasable memory and more particularly to charge storage devices for monitoring charging effect.

2. Description of Related Art

Electrically programmable and erasable nonvolatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising in memory cell structures based on charge trapping dielectric layers, because of the scalability and simplicity of the manufacturing processes. Memory cell structures based on charge trapping dielectric layers include structures known as N-bit memory. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

N-bit devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and the electron injection point do not coincide with each other, and some electrons remain after the erase pulse. In addition, during the sector erase of an N-bit flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become a more serious problem as the technology continues scaling down.

A traditional floating gate device stores 1 bit of charge in a conductive floating gate. N-bit devices have a plurality of cells where each N-bit cell provides two bits of flash cells that store charge in an Oxide-Nitride-Oxide (ONO) dielectric. In a typical structure of an N-bit memory cell, a nitride layer is used as a trapping material positioned between a top oxide layer and a bottom oxide layer. The ONO layer structure effectively replaces the gate dielectric in floating gate devices. The charge in the ONO dielectric with a nitrite layer may be either trapped on the left side or the right side of an N-bit cell.

Conventional program and erase techniques employ a channel hot electron method for programming and a band-to-band tunneling induced hot hole method for erasing. It is desirable to provide more efficient methods for programming and erasing nonvolatile memory.

SUMMARY OF THE INVENTION

Methods are described for double-side-biasing of a NAND memory array device comprising a plurality of charge trapping memory cells for programming and erasing the NAND memory array device. A double-side-biasing method applies a bias voltage simultaneously on a first junction (e.g., a source region) and a second junction (e.g., a drain region) so that a left bit and a right bit in a charge trapping memory cell can be programmed in parallel or erased in parallel. Random (or selective) bit program and random (or selective) bit erase can be achieved by using a double-side-biasing method on a NAND memory array device for both data and code applications. A first type of double-side-biasing method programs the NAND array with a double-side-bias electron-injection. A second type of double-side-biasing method is to erase the NAND array with a double-side-bias hole injection.

In a first embodiment, a double-side-bias electron injection programming method is combined with a double-side-bias hole injection erasing method to program and erase a NAND memory array device. A selective programming is conducted on the NAND memory array device by using a double-side-bias electron injection programming method. Selective programming is achieved by applying a positive word line voltage to a selected word line, and applying bit lines voltages to transistors that are to be programmed. A selective erasing operation is conducted on the NAND memory array device by using a double-side-bias hole injection erasing method. Selective erasing is achieved by applying a negative word line voltage to a selected word line, and applying bit lines voltages to transistors that are to be erased.

In a second embodiment, a Fowler-Nordheim tunneling (FN) programming method is combined with a double-side-bias hole injection erasing method to program and erase a NAND memory array device. A selective programming operation is conducted on the NAND memory array device by using a FN programming method. Selective programming is achieved by applying a high positive word line voltage. e.g. 20 volts, to a selected word line, and applying bit lines voltages to transistors that are to be programmed. A selective erasing operation is conducted on the NAND memory array device by using a double-side-bias hole injection programming method. Selective programming is achieved by applying a negative word line voltage to a selected word line, and applying bit lines voltages to transistors that are to be erased.

In a third embodiment, the NAND memory array device includes a plurality of charge trapping memory cells which each memory cell has a first trap site for storing a first bit and a second trap site for storing a second bit. During selective programming, a first channel hot electron programming method is applied to program the first bit in each selected charge trapping memory cell in the NAND memory array device. A second channel hot electron programming method is then used to program the second bit in each selected charge trapping memory cell in the NAND memory array device. A selective erasing is conducted on the NAND memory array device using a double-side-bias hole injection erasing method. Selective erasing is achieved by applying a negative word line voltage to a selected word line, and applying bit lines voltages to transistors that are to be erased.

Broadly stated, a method for double-side-biasing (DSB) a NAND memory device having a matrix of charge trapping memory cells in a memory array, each charge trapping memory cell having a first charge trapping site for storing a first bit and a second charge trapping site for storing a second bit, the matrix of charge trapping memory cells connecting to a plurality of word lines in row directions and plurality of bit lines in column directions, comprises electron-injection programming the one or more selected charge trapping memory cells in the matrix of charge trapping memory by simultaneously biasing a respective source terminal and a respective drain terminal in each of the plurality of charge trapping memory cells and applying a positive gate voltage to a select word line connecting to the plurality of charge trapping memory cells; and hole-injection erasing the one or more selected charge trapping memory cells in the matrix of charge trapping memory by simultaneously biasing a respective source terminal and a respective drain terminal in each of the plurality of charge trapping memory cells and applying a negative gate voltage to the select word line connecting to the plurality of charge trapping memory cells.

Advantageously, the double-side-bias electron injection method emulates a plus and minus FN operation with a smaller bias voltage and a fast operational speed.

The structures and methods of the present invention are disclosed in the detailed description below. This summary does not purport to define the invention. The invention is defined by the claims. These and other embodiments, features, aspects, and advantages of the invention will become better understood when read in conjunction with the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
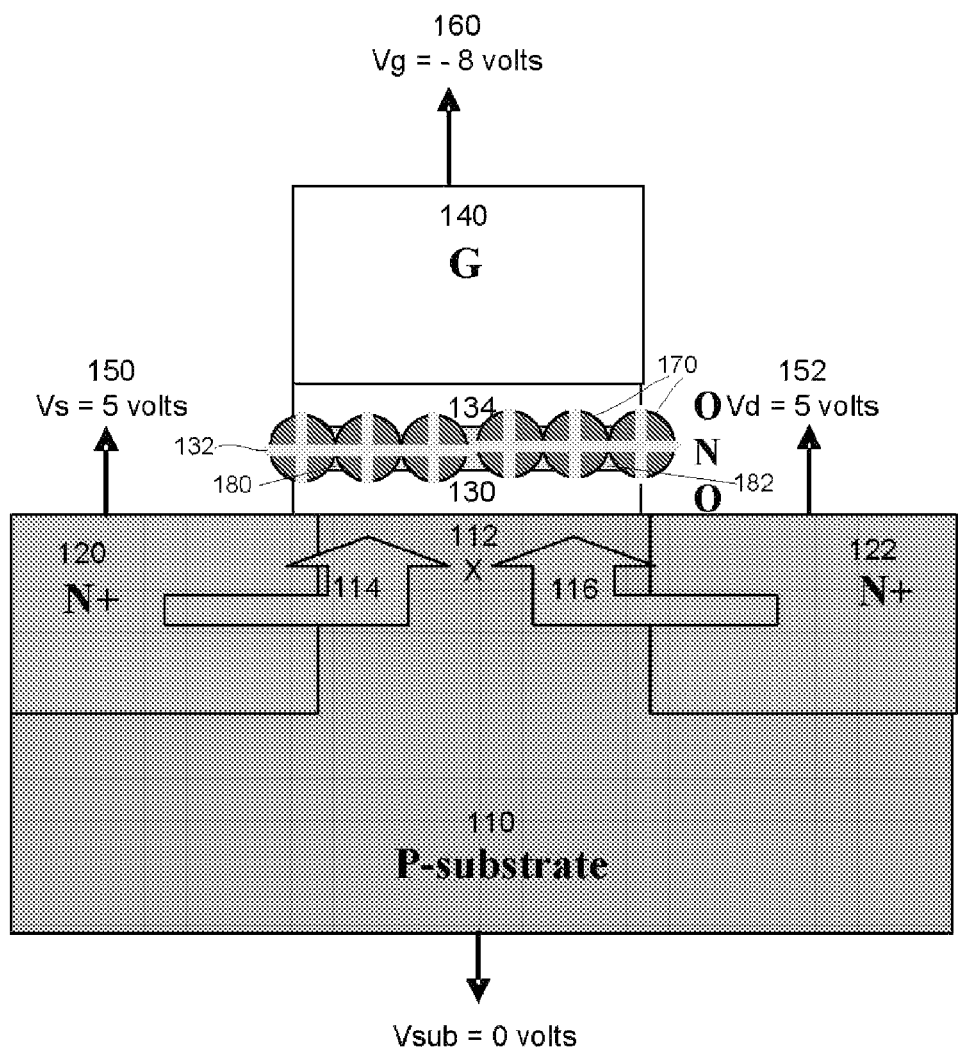
FIG. 1 is a process diagram illustrating a cross-sectional view of conducting an erase operation of a memory using a double-side-bias hole injection method in accordance with the present invention.

A description of structural embodiments and methods of the present invention is provided with reference to FIGS. 1-13. It is to be understood that there is no intention of limiting the invention to the specifically disclosed embodiments. Rather, the invention may be practiced using other features, elements, methods and embodiments. Like elements in various embodiments are commonly referred to with like reference numerals.

FIG. 1 is a process diagram illustrating a cross-sectional view of erasing a charge trapping memory cell (or N-bit) 100 by a double-side-bias (DSB) hole injection (HI) method. The charge trapping memory cell 100 comprises a p-substrate 110 with n+ doped regions 120 and 122, and a p-doped region between the n+ doped regions 120 and 122. A first directional flow 114 indicates the flow of hole charges from the n+ doped region 120, and a second directional flow 116 indicates the flow of hole charges from the n+ doped region 122. A channel width X 112 of the p-substrate 110 is positioned between the n+ doped region 120 on the left end and the n+ doped region 122 on the right end. A bottom dielectric structure 130 (bottom oxide) overlays a top surface of the channel width X 112 of the p-substrate 110. A charge trapping structure 132 (e.g. silicon nitride layer) overlays the bottom dielectric structure 130. A top dielectric structure (top oxide) 134 overlays the charge trapping structure 132. A polygate 140 overlays the top dielectric structure 134. The combination of the bottom dielectric structure 130, the charge trapping structure 132, and the top dielectric structure 134 is commonly referred as an ONO (oxide-nitride-oxide) structure. The width of the ONO structure, typically but not necessarily, aligns with the channel width X 112 of the p-substrate 110. The charge trapping memory cell 100 comprises a first charge trapping site 180 in the charge trapping structure 132, such as on the left side of the charge trapping structure 132 for storing one or more bits, and a second charge trapping site 182 in the charge trapping structure 132, such as on the right side of the charge trapping structure 132 for storing one or more bits. Representative top dielectrics include silicon dioxide and silicon oxynitride, or other similar high dielectric constant materials including for example $Al_2O_3$, having a thickness of about 5 to 10 nanometers. Representative bottom dielectrics include silicon dioxide and silicon oxynitride, or other similar high dielectric constant materials, having a thickness of about 3 to 10 nanometers. Representative charge trapping structures include silicon nitride, or other similar high dielectric constant materials, including metal oxides such as $Al_2O_3$, $HfO_2$, $CeO_2$, and others, having a thickness of about 3 to 9 nanometers. The charge trapping structure may be a discontinuous set of pockets or particles of charge trapping material, or a continuous layer as shown in the drawing.

The memory cell for N-bit-like cells has, for example, a bottom oxide with a thickness ranging from 3 nanometers to 10 nanometers, a charge trapping layer with a thickness ranging from 3 nanometers to 9 nanometers, and a top oxide with a thickness ranging from 5 nanometers to 10 nanometers. The memory cell for SONOS-like cells has, for example, a bottom oxide with a thickness ranging from 1 nanometer to 3 nanometers, a charge trapping layer with a thickness ranging from 3 nanometers to 9 nanometers, and a top oxide with a thickness ranging from 3 nanometers to 10 nanometers.

As generally used herein, programming refers to raising the threshold voltage of a memory cell and erasing refers to lowering the threshold voltage of a memory cell. However, the invention encompasses both products and methods where programming refers to raising the threshold voltage of a memory cell and erasing refers to lowering the threshold voltage of a memory cell, and products and methods where programming refers to lowering the threshold voltage of a memory cell and erase refers to raising the threshold voltage of a memory cell.

The charge trapping cell 100 is double-side-biased in the n+ doped regions 120 and 122, which can also be referred to as the source region 120 and the drain region 122. The term "double-side-bias" refers to biasing the source region 120 and the drain region 122 simultaneously. The term "simultaneously" as used in this application is to be interpreted broadly, including operating at the same time, overlapping, concurrent, in parallel, or around the same time. The bias voltage applied to the source region 120 and the drain region 122 can be the same voltage or a different voltage. In this embodiment, the same voltage of 5 volts is applied to the source region 120 and the drain region 122, which shows that a source voltage Vs 150 of 5 volts is applied to the source region 120 and a drain voltage Vd 152 of 5 volts is applied to the drain region 122.

A negative gate voltage –Vg 160, such as –8 volts, is applied to the polygate 140 in a double-side-bias hole injection method. In this embodiment, the negative gate voltage –Vg 160 of –10 volts is applied to the polygate 140 to enhance the hole injection efficiency. Hole charges 170 can be generated with a junction voltage, which is used to control hole generation efficiency.

Figure 2:
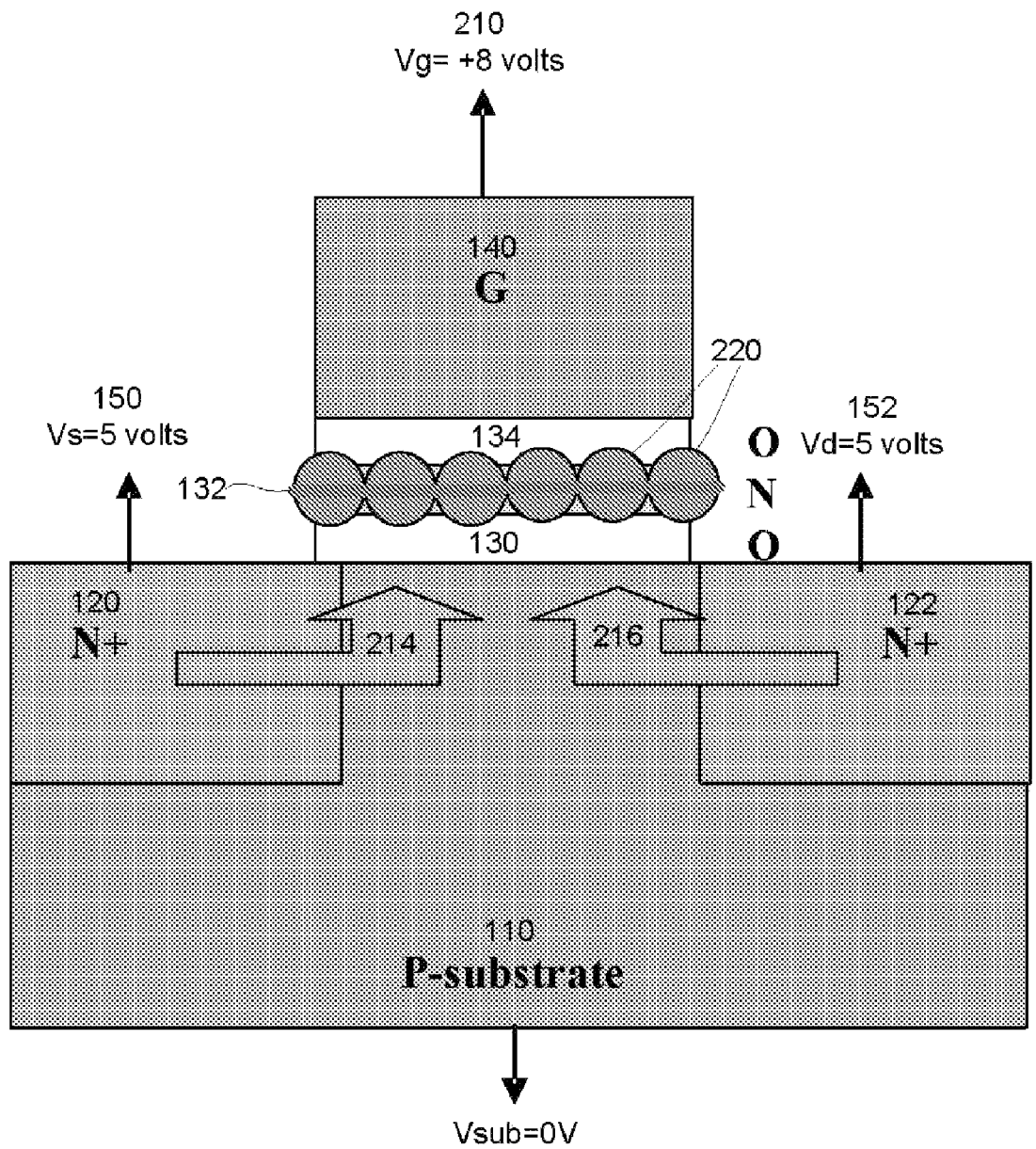
FIG. 2 is a process diagram illustrating a cross-sectional view of conducting a program operation of the memory by a double-side-bias electron injection method in accordance with the present invention.

FIG. 2 is a process diagram illustrating a cross-sectional view of the programming of the charge trapping memory cell 100 using a double-side-bias electron-injection (DSB-EI) method. The charge trapping cell 100 in FIG. 2 is also applied with the double-side-bias by applying the same voltages to the source region 120 and the drain region 122. The source voltage Vs 150 of 5 volts is applied to the source region 120. A first directional flow 214 indicates the flow of electron charges from the n+ doped region 120, and a second directional flow 216 indicates the flow of electron hole charges from the n+ doped region 122. The drain voltage Vd 152 of 5 volts is applied to the drain region 122. In an electron-injection method, a positive gate voltage +Vg 210 of +8 volts is applied to the polygate 140 to enhance the electron injection efficiency. Electron charges 220 can be generated with a junction voltage, which is used to control electron generation efficiency.

Figure 3:
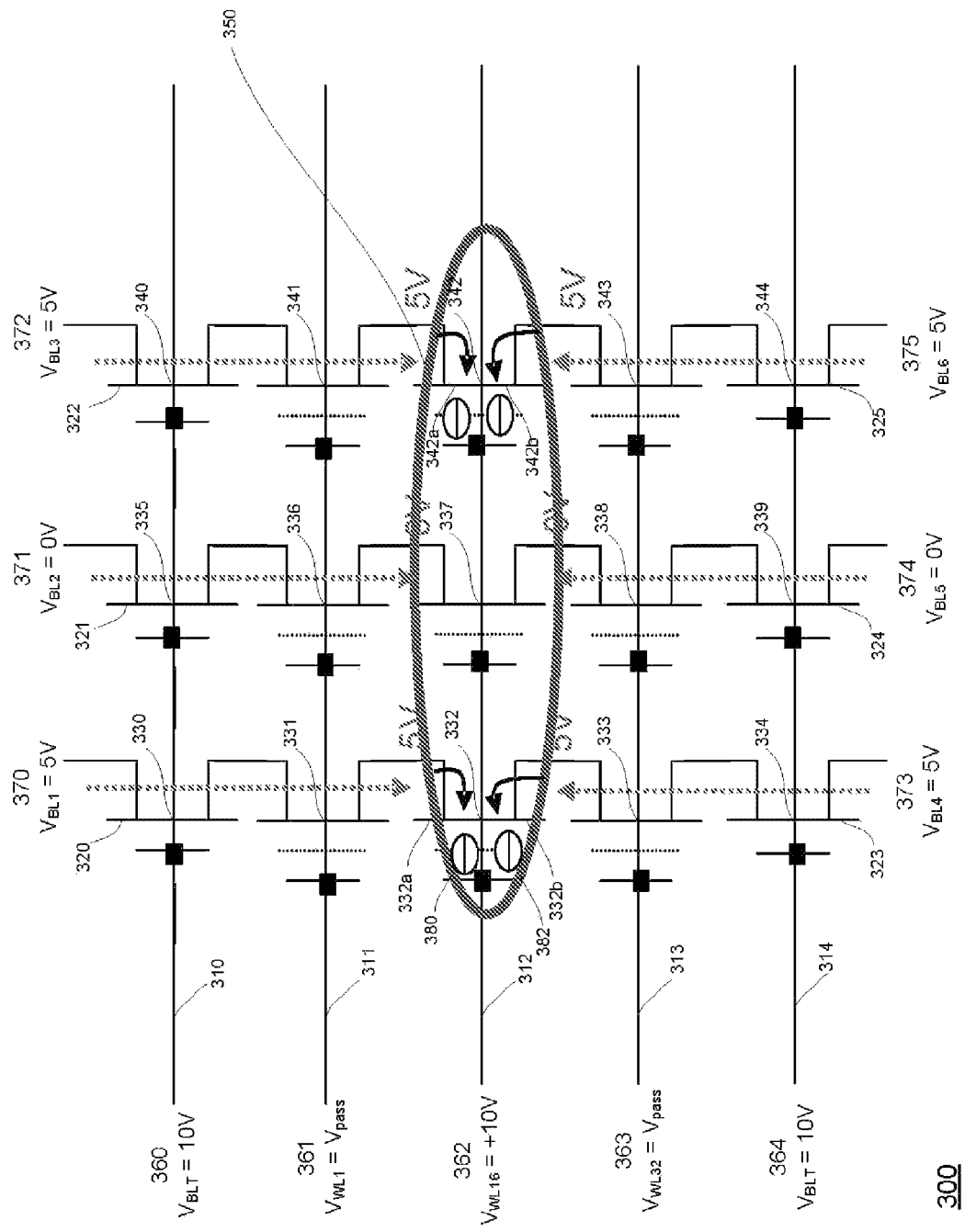
FIG. 3 is a circuit diagram illustrating a first embodiment of a method for programming a NAND array by programming using double-side-bias electron injection in accordance with the present invention.

FIG. 3 is a circuit diagram illustrating a first embodiment of a NAND memory array structure 300 in which a DSB-EI programming method is applied to selected word lines. The NAND memory array structure 300 comprises a plurality of word lines 310-314 in a first or horizontal direction intersecting a plurality of top bit lines 320-322 on an upper half in a second or vertical direction and intersecting a plurality of bottom bit lines 323-325 on a lower half in the second or vertical direction. The NAND memory array structure 300 further includes a plurality of transistors 330-344, where each transistor has a gate terminal, a first junction or a source terminal, and a second junction or a drain terminal.

The terms "selective programming or "random programming" refer to programming which bit or bits are to be programmed by a combination of a selected word line, and one or more selected top bit lines and one or more selected bottom bit lines. Unlike traditional programming techniques that program a block of memory in a memory array, selective or random programming involves programming on the basis of one or more bits. An individual bit can be selected for programming using selective or random programming.

In this embodiment, suppose that the word line 312 has been selected for selective or random programming. A voltage $V_{WL16}$ 362 of 10 volts is applied to the word line 312 as part of random programming to representative transistors encircled in 350. As a result, the transistors 332, 337 and 342 that are connected to the word line 312 can be selected for programming. Suppose the transistors 332 and 342 have been selected, but not the transistor 337, for programming.

To program a first or top junction 332a in the transistor 332, a first bit line voltage $V_{BL1}$ 370 is applied to the first bit line 320. The transistor 330 is turned on by applying a voltage $V_{BLT}$ 360 to the word line 310 in order to pass the first bit line voltage $V_{BL1}$ 320 downstream toward the transistor 332. The transistor 331 is turned on by setting a word line voltage $V_{WL1}$ 361 to a Vpass voltage and applying the Vpass voltage to the word line 311. The Vpass voltage is a voltage that is greater than a program voltage (PV) and sufficient to turn on a transistor. Given that the word line 311 has not been selected (or is an un-selected word line), the Vpass voltage serves to turn on a transistor device to pass a bit line voltage. At the same time, the un-selected word line does not require the application of as high a voltage, such as 10 volts, for the selected word line 312. The first bit line voltage $V_{BL1}$ 370 of 5 volts propagates downward through the transistor 330, the transistor 331, and to the first junction 332a (source or drain) in the transistor 332. The combination of the voltage $V_{WL16}$ 362 supplying +10 volts to the word line 312 and the first bit line voltage $V_{BL1}$ 370 supplying 5 volts to the first bit line 320 generates and causes electrons 380 to move into the first junction 332a in the transistor 332.

A fourth bit line voltage $V_{BL4}$ 373 is applied to the fourth bit line 323 to program a second junction or a bottom junction 322b in the transistor 332. The transistor 334 is turned on by applying a voltage $V_{BLT}$ 364 to the word line 314 in order to pass the fourth bit line voltage $V_{BL4}$ 373 upstream toward the transistor 332. The transistor 333 is turned on by setting a word line voltage $V_{WL32}$ 363 to a Vpass voltage and applying the Vpass voltage to the word line 313. The fourth bit line voltage $V_{BL4}$ 373 of 5 volts propagates upward through the transistor 334, the transistor 333 and to the second junction 332b (source or drain) in the transistor 332. Therefore, the DSB-EI programming method has been conducted by simultaneously programming the first junction 332a in the transistor 332 with the first bit line voltage $V_{BL1}$ 370 and the second junction 332b with the fourth bit line voltage $V_{BL4}$ 373 in the transistor 332. The first bit line voltage $V_{BL1}$ 370 of 5 volts propagates downward through the transistor 330, the transistor 331, and to the first junction 332a (source or drain) in the transistor 332. The combination of the voltage $V_{WL16}$ 362 supplying +10 volts to the word line 312 and the fourth bit line voltage $V_{BL4}$ 373 supplying 5 volts to the first bit line 320 generates and causes electrons 382 to move into the second junction 332b in the transistor 332.

In addition to the transistor 332, the transistor 342 connected to the word line 312 is also selected for random programming. To program a first or top junction 342a in the transistor 342, a third bit line voltage $V_{BL3}$ 372 is applied to the third bit line 322. The transistor 340 is turned on by applying a voltage $V_{BLT}$ 360 to the word line 310 in order to pass the third bit line voltage $V_{BL3}$ 372 downstream toward the transistor 342. The transistor 341 is turned on by setting a word line voltage $V_{WL1}$ 361 to a Vpass voltage and applying the Vpass voltage to the word line 311. The third bit line voltage $V_{BL3}$ 372 of 5 volts propagates downward through the transistor 340, the transistor 341, and to the first junction 342a (source or drain) in the transistor 342.

A sixth bit line voltage $V_{BL6}$ 375 is applied to the sixth bit line 325 to program a second junction or a bottom junction 342b in the transistor 342. The transistor 344 is turned on by applying a voltage $V_{BLT}$ 364 to the word line 314 in order to pass the sixth bit line voltage $V_{BL6}$ 375 upstream toward the transistor 342. The transistor 343 is turned on by setting a word line voltage $V_{WL21}$ 363 to a Vpass voltage and applying the Vpass voltage to the word line 313. The sixth bit line voltage $V_{BL6}$ 375 of 5 volts propagates upward through the transistor 344, the transistor 343 and to the second junction 342b (source or drain) in the transistor 332. Therefore, the DSB-EI programming method has been conducted by simultaneously programming the first junction 342a in the transistor 342 with the third bit line voltage $V_{BL3}$ 372 and the second junction 342b with the sixth bit line voltage $V_{BL6}$ 375 in the transistor 342.

The transistor 337, connected to the word line 362, has not been selected for programming in this example. When a transistor is not selected for programming, a respective bit line does not apply any voltage to a junction of a transistor. The second bit line voltage $V_{BL2}$ 371, connected to the second bit line 321, has about 0 volts. The fifth bit line voltage $V_{BL5}$ 374, connected to the fifth bit line 324, has about 0 volts.

Figure 4:
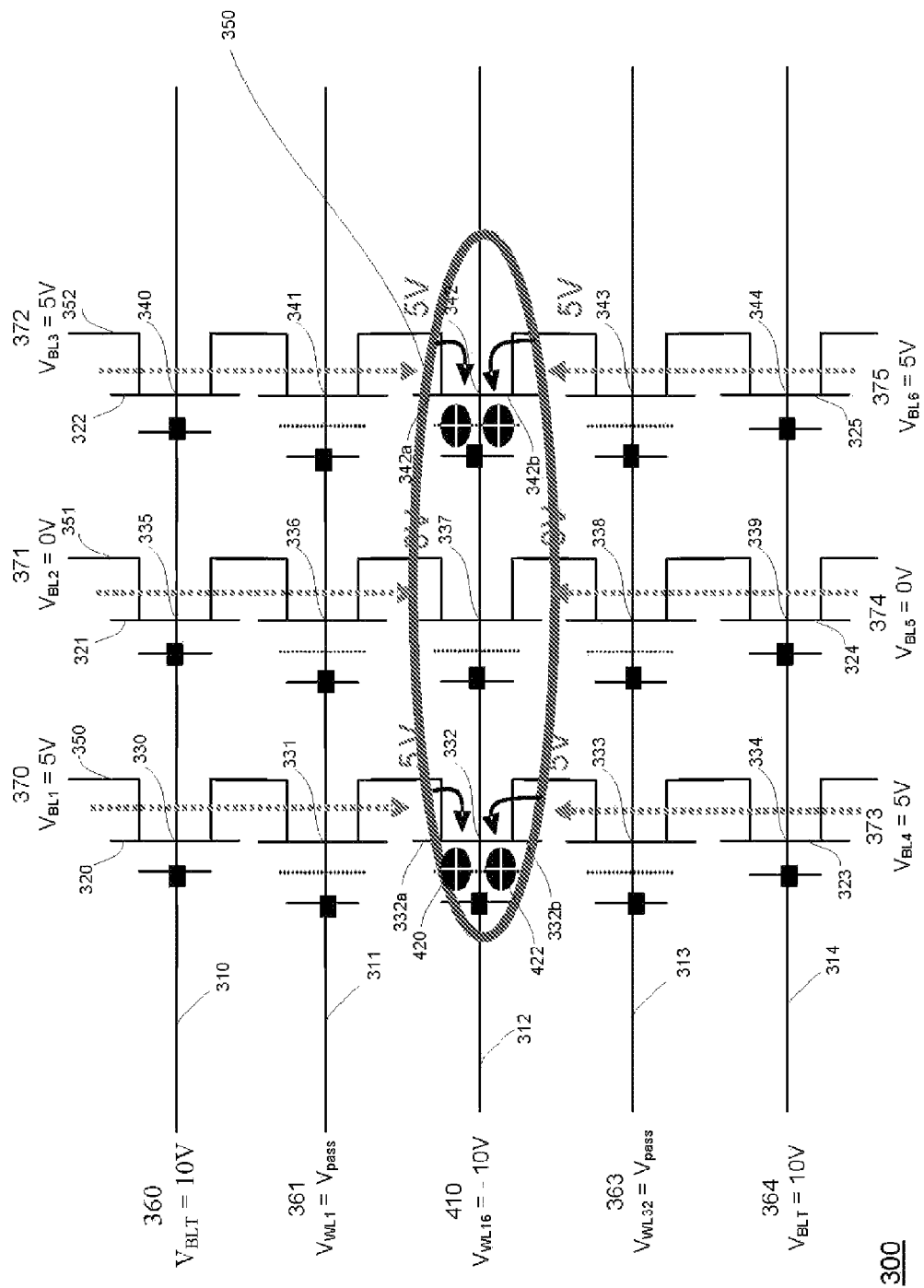
FIG. 4 is a circuit diagram illustrating a first embodiment of a method for erasing the NAND array using double-side-bias hole injection in accordance with the present invention.

FIG. 4 is a circuit diagram illustrating a first embodiment of a NAND memory structure 300 in which a DSB-HI erasing method is applied to selected word lines. The double-side-bias hole injection erasing of the NAND array structure 400 is also conducted based on random (or selective) erasing, which means that an erase operation can be carried out on a bit-by-bit basis, instead of a block erase. In this illustration, the transistors 332 and 342 are selected for erase using the double-side-bias hole injection method. To conduct the double-side-bias hole injection method, a negative word line voltage 410, $V_{WL16}$, is applied to the word line 312, which is connected commonly to gate terminals of the transistors 332, 337, 342. One exemplary voltage of the negative voltage applied to the word line 312 is about −10 volts.

To erase a first or top junction 332a in the transistor 332, a first bit line voltage $V_{BL1}$ 370 is applied to the first bit line 320. The transistor 330 is turned on by applying a voltage $V_{BLT}$ 360 to the word line 310 in order to pass the first bit line voltage $V_{BL1}$ 320 downstream toward the transistor 332. The transistor 331 is turned on by setting a word line voltage $V_{WL1}$ 361 to a Vpass voltage and applying the Vpass voltage to the word line 311. The Vpass voltage is a voltage that is greater than a program voltage (PV) and sufficient to turn on a transistor. Given that the word line 311 has not been selected (or is an un-selected word line), the Vpass voltage serves to turn on a transistor device to pass a bit line voltage. At the same time, the un-selected word line does not require the application of as high a voltage, such as 10 volts, for the selected word line 312. The first bit line voltage $V_{BL1}$ 370 of 5 volts propagates downward through the transistor 330, the transistor 331, and to the first junction 332a (source or drain) in the transistor 332. The combination of the voltage $V_{WL16}$ 410 supplying −10 volts to the word line 312 and the first bit line voltage $V_{BL1}$ 370 supplying 5 volts to the first bit line 320 generates and causes holes 420 to move into the first junction 332a in the transistor 332.

A fourth bit line voltage $V_{BL4}$ 373 is applied to the fourth bit line 323 to erase a second junction or a bottom junction 322b in the transistor 332. The transistor 334 is turned on by applying a voltage $V_{BLT}$ 364 to the word line 314 in order to pass the fourth bit line voltage $V_{BL4}$ 373 upstream toward the transistor 332. The transistor 333 is turned on by setting a word line voltage $V_{WL32}$ 363 to a Vpass voltage and applying the Vpass voltage to the word line 313. The fourth bit line voltage $V_{BL4}$ 373 of 5 volts propagates upward through the transistor 334, the transistor 333 and to the second junction 332b (source or drain) in the transistor 332. Therefore, the DSB-HI erasing method has been conducted by simultaneously programming the first junction 332a in the transistor 332 with the first bit line voltage $V_{BL1}$ 370 and the second junction 332b with the fourth bit line voltage $V_{BL4}$ 373 in the transistor 332. The first bit line voltage $V_{BL1}$ 370 of 5 volts propagates downward through the transistor 330, the transistor 331, and to the first junction 332a (source or drain) in the transistor 332. The combination of the voltage $V_{WL16}$ 410 supplying −10 volts to the word line 312 and the fourth bit line voltage $V_{BL4}$ 373 supplying 5 volts to the fourth bit line 323 generates and causes holes 422 to move into the second junction 332b in the transistor 332.

Figure 5:
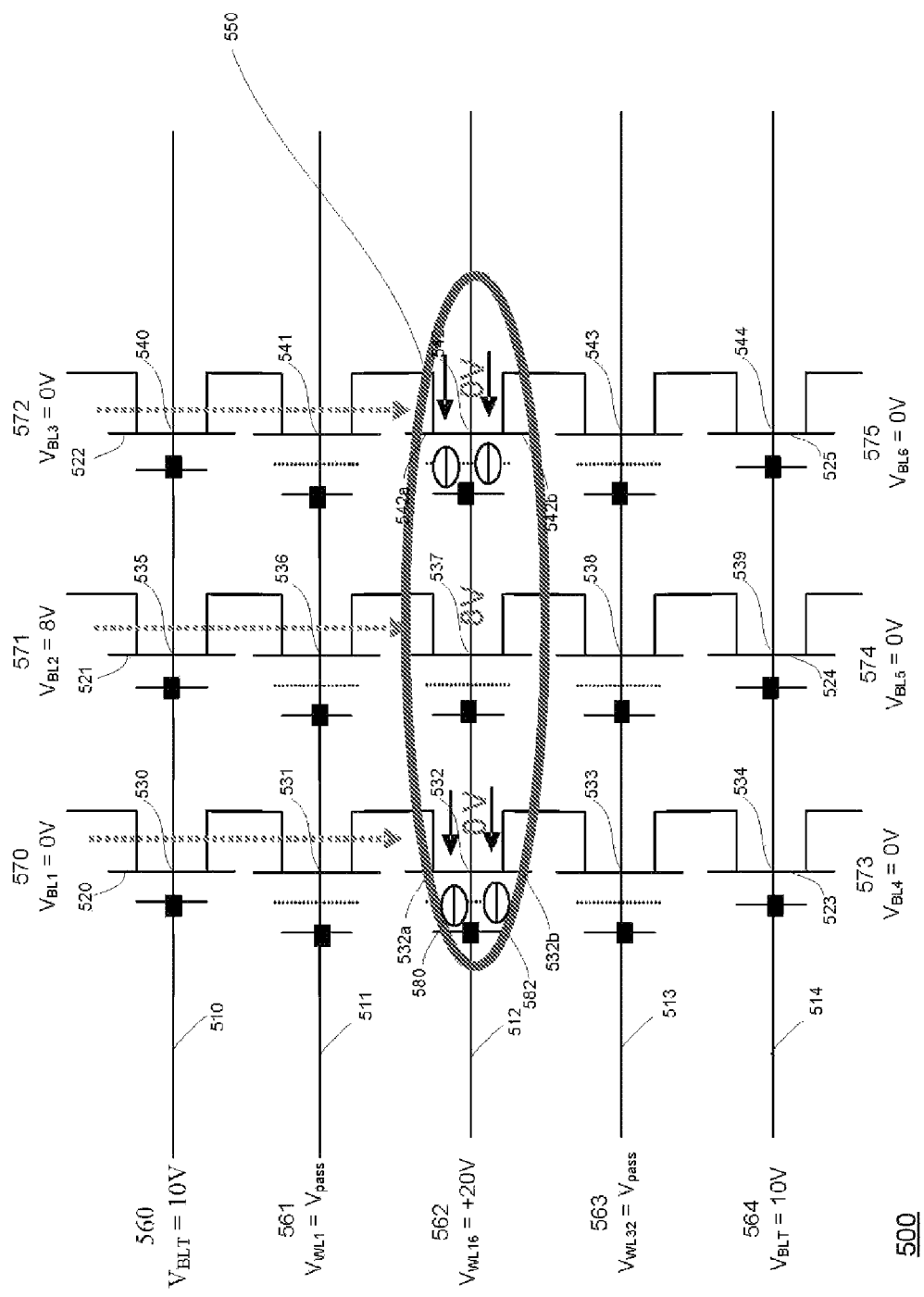
FIG. 5 is a circuit diagram illustrating a second embodiment of a method for programming a NAND array by programming with Fowler-Nordheim tunneling in accordance with the present invention.

FIG. 5 is a circuit diagram of an NAND memory structure 500 illustrating a second method embodiment in which a FN method is applied to selected word lines for selective or random programming. The NAND memory array structure 500 comprises a plurality of word lines 510-514 in a first or horizontal direction intersecting a plurality of top bit lines 520-522 on an upper half in a second or vertical direction and intersecting a plurality of bottom bit lines 523-525 on a lower half in the second or vertical direction. The NAND memory array structure 500 further includes a plurality of transistors 530-544, where each transistor has a gate terminal, a first junction or a source terminal, and a second junction or a drain terminal. In this embodiment, suppose that the word line 512 has been selected for selective or random programming to representative transistors encircled in 550. A voltage $V_{WL16}$ 562 of +20 volts is applied to the word line 512 as part of random programming. As a result, the transistors 532, 537 and 542 that are connected to the word line 512 can be selected for programming. Suppose the transistors 532 and 542 have been selected, but not the transistor 537, for programming.

In programming the transistor 532, the first bit line voltage $V_{BL1}$ 570 supplies 0 volts to a first bit line 520. The combination of the voltage $V_{WL16}$ 562 supplying +20 volts to the word line 512 and the first bit line voltage $V_{BL1}$ 570 supplying 0 volts to the first bit line 520, creating a differential voltage of 20 volts that is sufficient for FN programming, would generate and cause electrons 580 to move into the first junction 532a in the transistor 532. A fourth bit line voltage $V_{BL4}$ 573 supplies 0 volts to the fourth bit line 523. The combination of the voltage $V_{WL16}$ 562 supplying +20 volts to the word line 512 and the fourth bit line voltage $V_{BL4}$ 373 supplying 0 volts to the first bit line 320, creating a differential voltage of 20 volts sufficient for FN programming, would generate and cause electrons 582 to move into the second junction 532b in the transistor 532.

In programming the transistor 542, the first bit line voltage $V_{BL1}$ 570 of 0 volts is applied to a first bit line 520. The combination of the voltage $V_{WL16}$ 562 supplying +20 volts to the word line 512 and the first bit line voltage $V_{BL1}$ 570 supplying 0 volts to the first bit line 520, creating a differential voltage of 20 volts sufficient for FN programming, would generate and cause electrons 580 to move into the first junction 532a in the transistor 532. A fourth bit line voltage $V_{BL4}$ 573 supplies 0 volts to the fourth bit line 523. The combination of the voltage $V_{WL16}$ 562 supplying +20 volts to the word line 512 and the fourth bit line voltage $V_{BL4}$ 373 supplying 0 volts to the first bit line 320, creating a differential voltage of 20 volts sufficient for FN programming, would generate and cause electrons 582 to move into the second junction 532b in the transistor 532.

The transistor 537 has not been selected for random programming. A second bit line voltage $V_{BL2}$ 571 supplies 8 volts to the second bit line 521. The transistor 535 is turned on by applying a voltage $V_{BLT}$ 560 to the word line 510 in order to pass the second bit line voltage $V_{BL2}$ 521 downstream toward the transistor 536. The transistor 536 is turned on by setting a word line voltage $V_{WL1}$ 561 to a Vpass voltage and applying the Vpass voltage to the word line 511. The Vpass voltage is a voltage that is greater than a program voltage and sufficient to turn on a transistor. Given that the word line 511 has not been selected (or is an un-selected word line), the Vpass voltage serves to turn on a transistor device to pass a bit line voltage. The second bit line voltage $V_{BL2}$ 571 of 8 volts propagates downward through the transistor 535, through the transistor 536, and to the transistor 537. The combination of the voltage $V_{WL16}$ 562 supplying +20 volts to the word line 512 and the first bit line voltage $V_{BL1}$ 570 supplying 0 volts to the first bit line 520, creates a differential voltage of 12 volts, which is insufficient to turn on the transistor 537 for FN programming.

Figure 6:
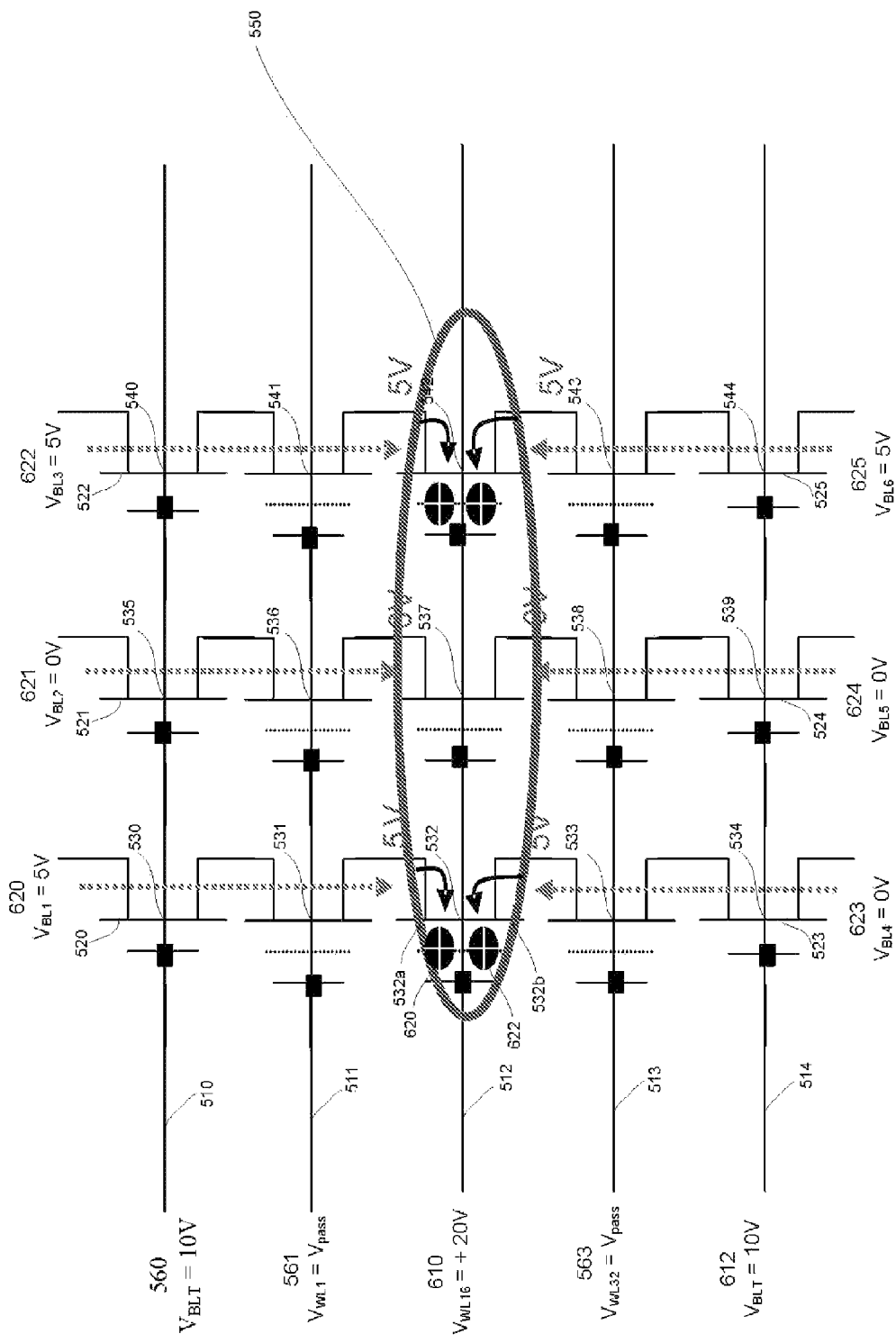
FIG. 6 is a circuit diagram illustrating a second embodiment of a method for erasing the NAND array by erasing using double-side-bias hole injection in accordance with the present invention.

FIG. 6 is a circuit diagram of a NAND memory structure 500 illustrating a second method embodiment in which a DSB-HI technique is applied to selected word lines. The double-side-bias hole injection, in erasing the NAND array structure 600, is also conducted based on random (or selective) erasing, which means that an erase operation can be carried out on a bit-by-bit basis, instead of a block erase. In this illustration, the transistors 532 and 542 are selected for erase using the double-side-bias hole injection method. To conduct the double-side-bias hole injection method, a negative word line voltage 510, $V_{WL16}$, is applied to the word line 512, which is connected commonly to gate terminals of the transistors 532, 537, 542. One exemplary voltage of the negative voltage applied to the word line 512 is about −10 volts.

To erase a first or top junction 532a in the transistor 532, a first bit line voltage $V_{BL1}$ 570 is applied to the first bit line 520. The transistor 530 is turned on by applying a voltage $V_{BLT}$ 560 to the word line 510 in order to pass the first bit line voltage $V_{BL1}$ 520 downstream toward the transistor 532. The transistor 531 is turned on by setting a word line voltage $V_{WL1}$ 561 to a Vpass voltage and applying the Vpass voltage to the word line 511. The Vpass voltage is a voltage that is greater than a program voltage (PV) and sufficient to turn on a transistor. Given that the word line 511 has not been selected (or is an un-selected word line), the Vpass voltage serves to turn on a transistor device to pass a bit line voltage. At the same time, the un-selected word line does not require the application of as high a voltage, such as 10 volts, for the selected word line 512. The first bit line voltage $V_{BL1}$ 570 of 5 volts propagates downward through the transistor 530, through the transistor 531, and to the first junction 532a (source or drain) in the transistor 532. The combination of the voltage $V_{WL16}$ 410 supplying −10 volts to the word line 512 and the first bit line voltage $V_{BL1}$ 570 supplying 5 volts to the first bit line 520 generates and causes holes 620 to move into the first junction 532a in the transistor 532.

A fourth bit line voltage $V_{BL4}$ 573 is applied to the fourth bit line 523 to erase a second junction or a bottom junction 522b in the transistor 532. The transistor 534 is turned on by applying a voltage $V_{BLT}$ 564 to the word line 514 in order to pass the fourth bit line voltage $V_{BL4}$ 573 upstream toward the transistor 532. The transistor 533 is turned on by setting a word line voltage $V_{WL32}$ 563 to a Vpass voltage and applying the Vpass voltage to the word line 513. The fourth bit line voltage $V_{BL4}$ 573 of 5 volts propagates upward through the transistor 534, the transistor 533 and to the second junction 532b (source or drain) in the transistor 532. Therefore, the DSB-HI erasing method has been conducted by simultaneously programming the first junction 532a in the transistor 532 with the first bit line voltage $V_{BL1}$ 570 and the second junction 532b with the fourth bit line voltage $V_{BL4}$ 573 in the transistor 532. The first bit line voltage $V_{BL1}$ 570 of 5 volts propagates downward through the transistor 530, the transistor 531, and to the first junction 532a (source or drain) in the transistor 532. The combination of the voltage $V_{WL16}$ 510 supplying −10 volts to the word line 512 and the fourth bit line voltage $V_{BL4}$ 573 supplying 5 volts to the first bit line 520 generates and causes holes 622 to move into the second junction 532b in the transistor 532.

Figure 7:
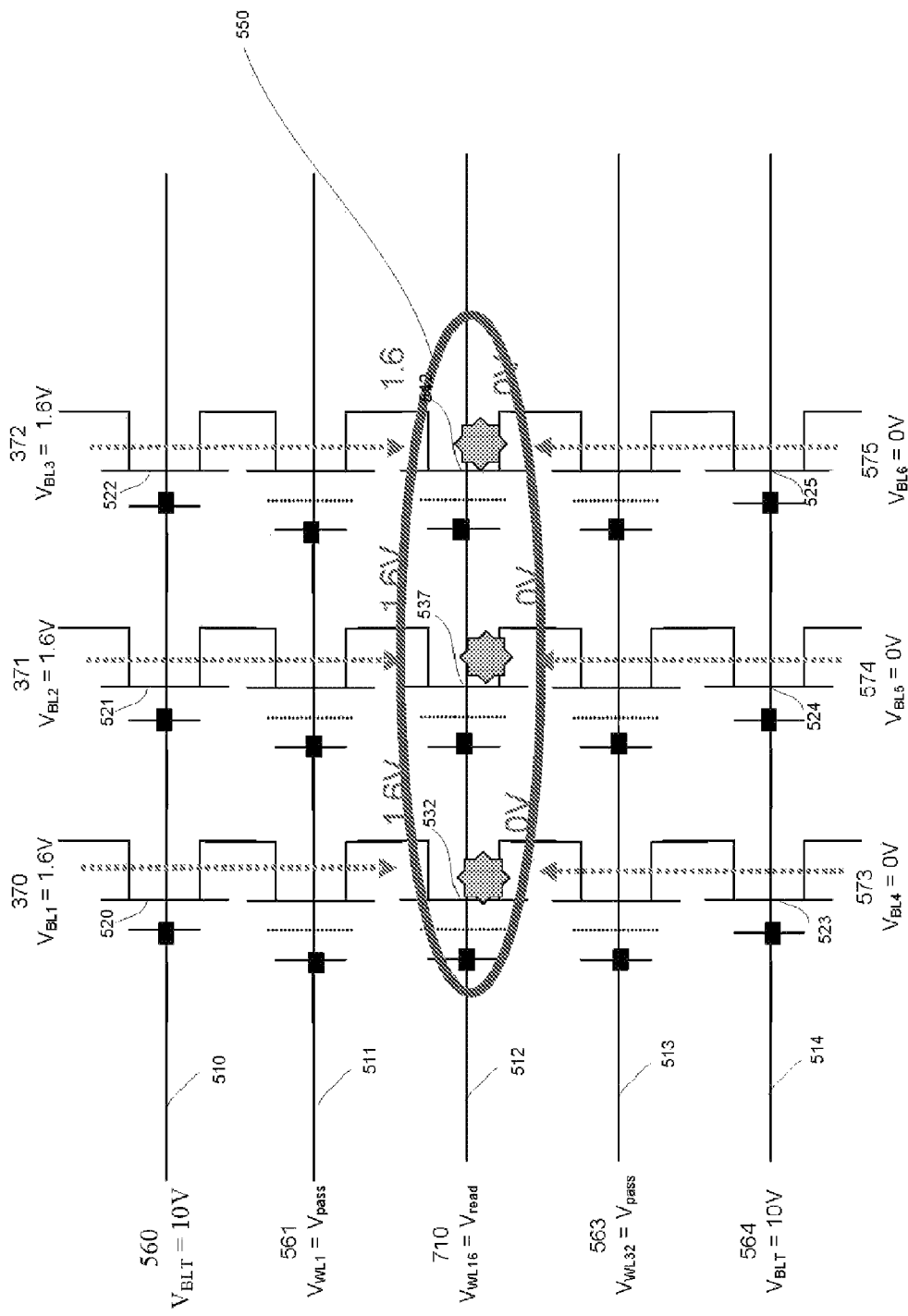
FIG. 7 is a circuit diagram illustrating a one-bit cell read operation from a top bit line transistor in the NAND array in accordance with the present invention.

FIG. 7 is a circuit diagram of the NAND memory structure 500 illustrating a 1-bit cell read operation with a drain voltage Vd from a top bit line transistor BLT. A read voltage 710 is selected between an erase voltage (EV) and a program voltage (PV). For example, the erase voltage level may be set at about 2 volts and the program voltage level may be set at about 4 volts. A suitable read voltage in this example would be about 3 volts. The voltage $V_{WL16}$ 710 supplies the read voltage to the word line 512 that is connected to the transistors 532, 527 and 542. A differential voltage of 1.6 volts between drain and source regions in the transistor 532 is created by applying a first bit line voltage $V_{BL1}$ 720 to the first line bit 520 and applying the fourth bit line voltage $V_{BL4}$ 573 of 0 volts to the fourth bit line 523. Similarly, a differential voltage of 1.6 volts between drain and source regions in the transistor 537 is created by applying a second bit line voltage $V_{BL2}$ 721 to the second line bit 521 and applying the fifth bit line voltage $V_{BL5}$ 574 of 0 volts to the fifth bit line 524. Furthermore, a differential voltage of 1.6 volts between drain and source regions in the transistor 542 is created by applying a third bit line voltage $V_{BL3}$ 722 to the third line bit 522 and applying the sixth bit line voltage $V_{BL6}$ 575 of 0 volts to the sixth bit line 525. Word line voltages $V_{WL1}$ 561 and $V_{WL32}$ 563 supply a Vpass voltage to word lines 511, 513, respectively, without read disturbances. The Vpass voltage is selected to be a voltage value greater than a program voltage in order to turn on a transistor device.

Figure 8:
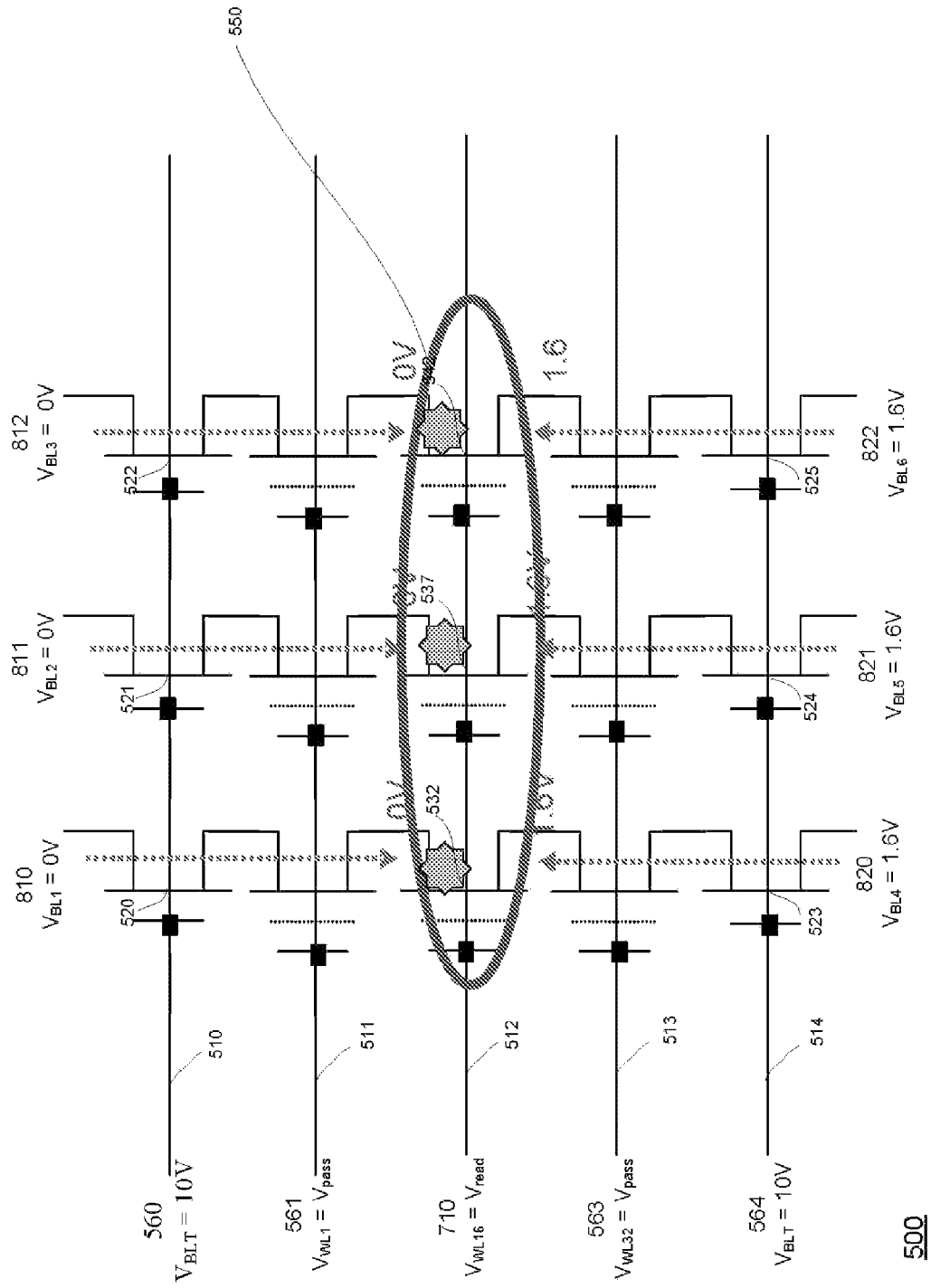
FIG. 8 is a circuit diagram illustrating a one-bit cell read operation from a bottom bit line transistor in the NAND array in accordance with the present invention.

FIG. 8 is a circuit diagram of the NAND memory structure 500 illustrating a 1-bit cell read operation with a drain voltage Vd from a bottom bit line transistor BLT. The read voltage 710 is selected between an erase voltage and a program voltage. The voltage $V_{WL16}$ 710 supplies the read voltage to the word line 512 that is connected to the transistors 532, 537 and 542. A differential voltage of 1.6 volts between drain and source regions in the transistor 532 is created by applying a first bit line voltage $V_{BL1}$ 810 of 0 volts to the first line bit 520 and applying the fourth bit line voltage $V_{BL4}$ 820 of 1.6 volts to the fourth bit line 523. Similarly, a differential voltage of 1.6 volts between drain and source regions in the transistor 537 is created by applying a second bit line voltage $V_{BL2}$ 811 of 0 volts to the second line bit 521 and applying the fifth bit line voltage $V_{BL5}$ 821 of 1.6 volts to the fifth bit line 524. Furthermore, a differential voltage of 1.6 volts between drain and source regions in the transistor 542 is created by applying a third bit line voltage $V_{BL3}$ 812 to the third line bit 522 and applying the sixth bit line voltage $V_{BL6}$ 822 of 1.6 volts to the sixth bit line 525. Word line voltages $V_{WL1}$ 561 and $V_{WL32}$ 563 supply a Vpass voltage to word lines 511, 513, respectively, without read disturbances. The Vpass voltage is selected to be a voltage value greater than a program voltage in order to turn on a transistor device.

Figure 9:
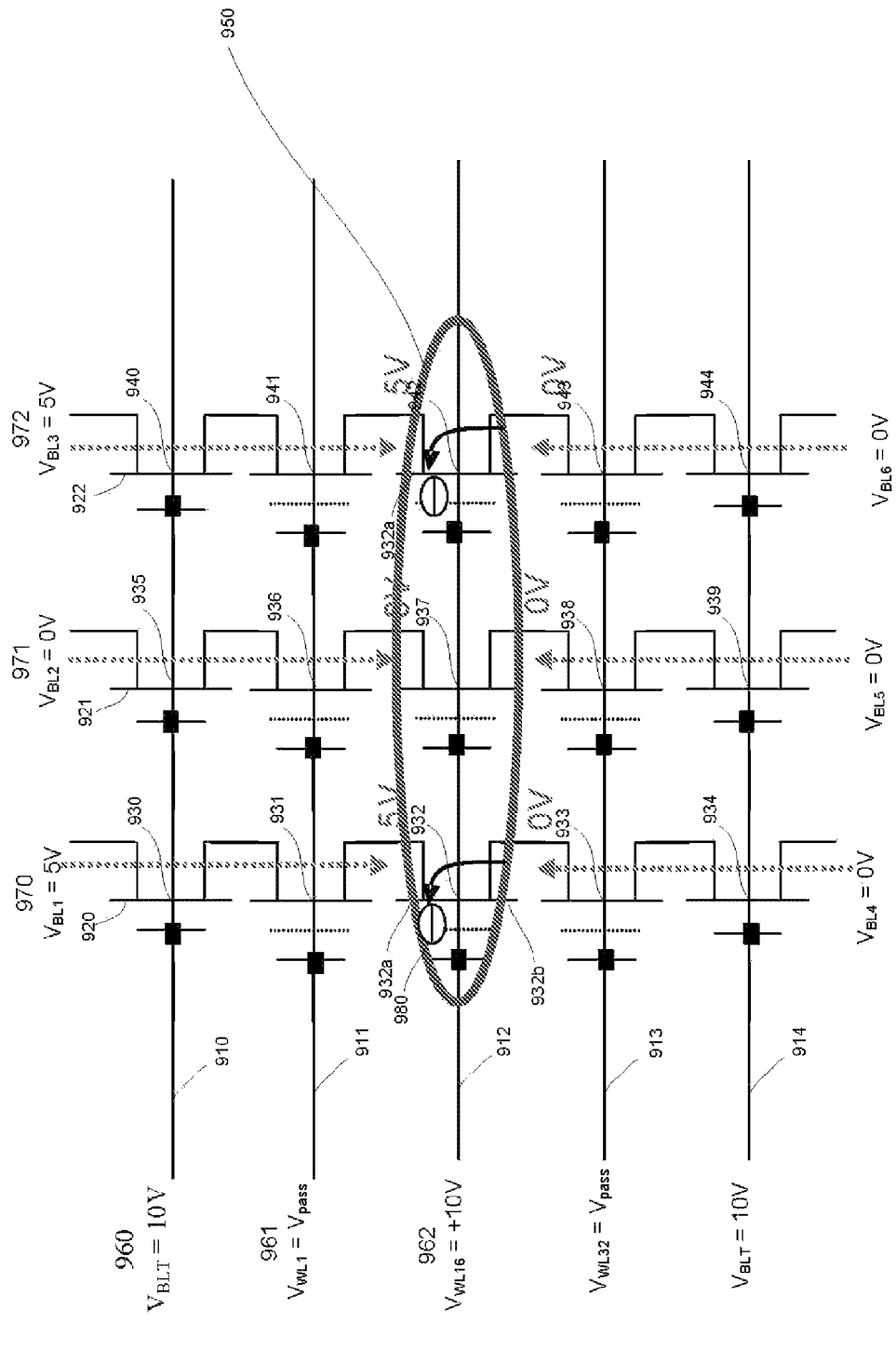
FIG. 9 is a circuit diagram illustrating a third embodiment of a method for programming a NAND array using channel hot electron programming on one or more right bits in the NAND array in accordance with the present invention.

FIG. 9 is a circuit diagram of the NAND memory structure 900 illustrating a third method embodiment in which a channel hot electron (CHE) program is applied to a right bit bit-R. The NAND memory array structure 900 comprises a plurality of word lines 910-914 in a first or horizontal direction intersecting a plurality of top bit lines 920-922 on an upper half in a second or vertical direction and intersecting a plurality of bottom bit lines 923-925 on a lower half in the second or vertical direction. The NAND memory array structure 900 further includes a plurality of transistors 930-944, where each transistor has a gate terminal, a first junction or a source terminal, and a second junction or a drain terminal. Each transistor in the plurality of transistors 930-944 is a nitride trapping memory cell where each nitride trapping memory cell includes two trap sites (e.g., a left bit site for storing a left bit and a right bit site for storing a right bit) for storing 2 bits of information.

In this embodiment, suppose that the word line 912 has been selected for selective or random programming. A voltage $V_{WL16}$ 962 of 10 volts is applied to the word line 912 as part of random programming to representative transistors encircled in 950. As a result, the transistors 932, 937 and 942 that are connected to the word line 912 can be selected for programming. Suppose it is determined that transistors 932 and 942 are to be programmed but not transistor 937.

The two trap sites in a nitride trapping memory cell are programmed separately using a channel hot programming technique. For example, a right bit of the nitride trapping memory cell is programmed first using the channel hot programming technique. A left bit of the nitride trapping memory cell is then programmed using the channel hot programming technique.

To program a right trap site 932a in the transistor 932, a first bit line voltage $V_{BL1}$ 970 of 5 volts is applied to the first bit line 920. The transistor 930 is turned on by applying a voltage $V_{BLT}$ 960 to the word line 910 in order to pass the first bit line voltage $V_{BL1}$ 920 downstream toward the transistor 932. The transistor 931 is turned on by setting a word line voltage $V_{WL1}$ 961 to a Vpass voltage and apply the Vpass voltage to the word line 911. The Vpass voltage is a voltage that is greater than a program voltage and sufficient to turn on a transistor. Given that the word line 911 has not been selected (or is an un-selected word line), the Vpass voltage serves to turn on a transistor device to pass a bit line voltage. At the same time, the un-selected word line does not require the application of as high a voltage for the selected word line 912. The first bit line voltage $V_{BL1}$ 970 of 5 volts propagates downward through the transistor 930, through the transistor 931, and to the first junction 932a (source or drain) in the transistor 932. The combination of the voltage $V_{WL16}$ 962 supplying +10 volts to the word line 912 and the first bit line voltage $V_{BL1}$ 970 supplying 5 volts to the first bit line 920, generates and causes electrons 980 to move into the right bit site 932a in the transistor 932.

In addition to the transistor 932, the transistor 942, which is connected to the word line 912, is also selected for random programming. To program a right bit site 942a in the transistor 942, a third bit line voltage $V_{BL3}$ 972 of 5 volts is applied to the third bit line 922. The transistor 940 is turned on by applying a voltage $V_{BLT}$ 960 to the word line 910 in order to pass the third bit line voltage $V_{BL3}$ 972 downstream toward the transistor 942. The transistor 941 is turned on by setting a word line voltage $V_{WL1}$ 961 to a Vpass voltage and applying the Vpass voltage to the word line 911. The third bit line voltage $V_{BL3}$ 972 of 5 volts propagates downward through the transistor 940, through the transistor 941, and to the right bit site 942a in the transistor 942.

The transistor 937, connected to the word line 962, has not been selected for programming in this example. When a transistor is not selected for programming, a respective bit line does not apply any voltage to a junction of a transistor. The second bit line voltage $V_{BL2}$ 971, connected to the second bit line 921, has about 0 volts.

Figure 10:
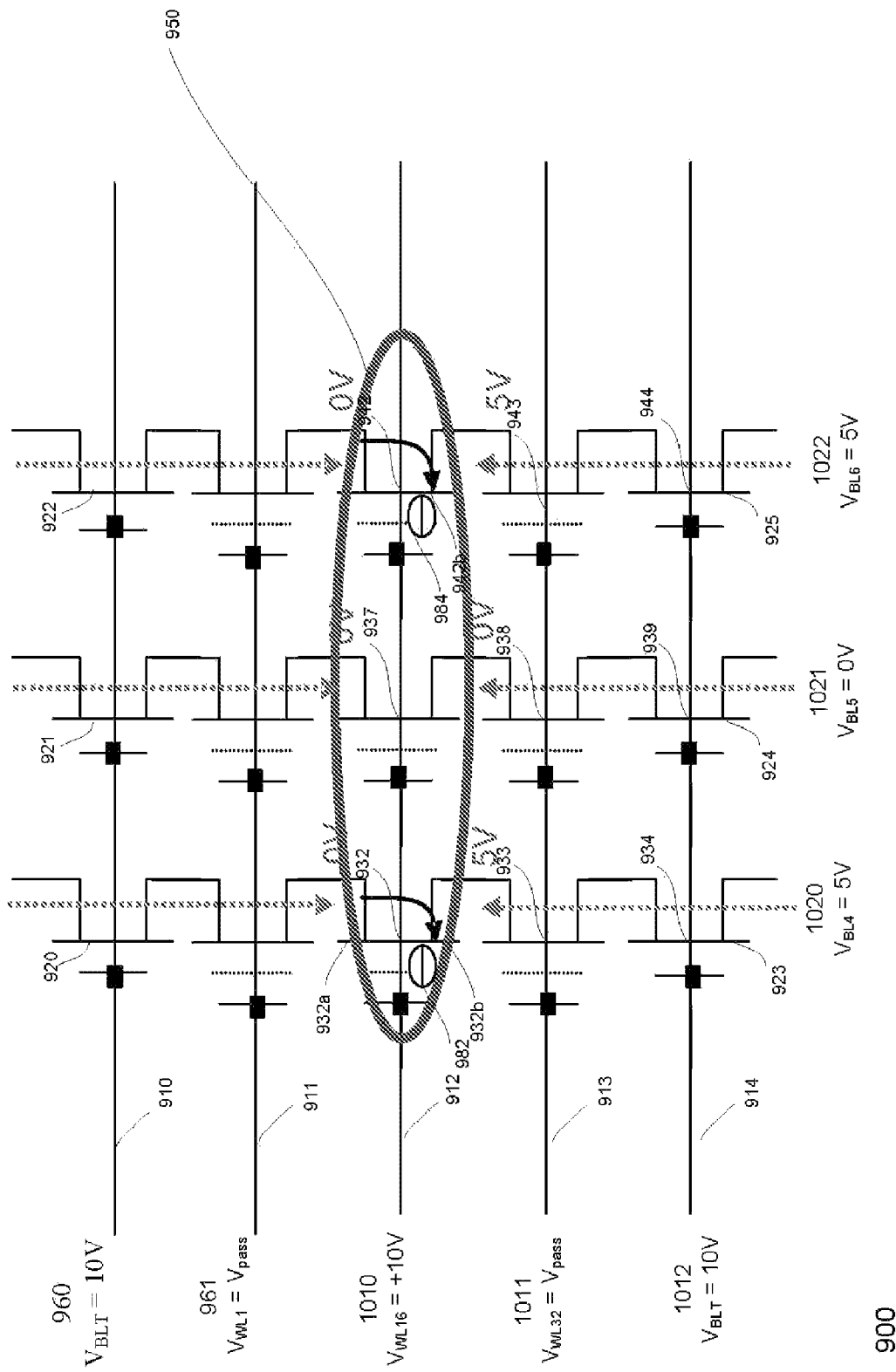
FIG. 10 is a circuit diagram illustrating a third embodiment of a method for programming the NAND array using channel hot electron programming on one or more left bits in the NAND array in accordance with the present invention.

FIG. 10 is a circuit diagram of the NAND memory structure illustrating a third method embodiment in which a channel hot electron (CHE) program is applied to a left bit bit-L. To program a left trap site 932b in the transistor 932, a fourth bit line voltage $V_{BL4}$ 1020 of 5 volts is applied to the fourth bit line 923. The transistor 934 is turned on by applying a voltage $V_{BLT}$ 1012 to the word line 914 in order to pass the fourth bit line voltage $V_{BL4}$ 1020 upstream toward the transistor 932. The transistor 933 is turned on by setting a word line voltage $V_{WL32}$ 1011 to a Vpass voltage and applying the Vpass voltage to the word line 913. The Vpass voltage is a voltage that is greater than a program voltage and sufficient to turn on a transistor. Given that the word line 913 has not been selected (or is an un-selected word line), the Vpass voltage serves to turn on a transistor device to pass a bit line voltage. At the same time, the un-selected word line does not require the application of as high a voltage for the selected word line 912. The fourth bit line voltage $V_{BL4}$ 1020 of 5 volts propagates upward through the transistor 934, through the transistor 933, and to the left trap site 932b in the transistor 932. The combination of the voltage $V_{WL16}$ 1010 supplying +10 volts to the word line 912, and the fourth bit line voltage $V_{BL4}$ 1020 supplying 5 volts to the fourth bit line 923, generates and causes electrons 982 to move into the left bit site 932b in the transistor 932.

In addition to the transistor 932, the transistor 942, which is connected to the word line 912, is also selected for random programming. To program a left trap site 942b in the transistor 942, a sixth bit line voltage $V_{BL6}$ 1022 of 5 volts is applied to the sixth bit line 925. The transistor 944 is turned on by applying the voltage $V_{BLT}$ 1012 to the word line 914 in order to pass the sixth bit line voltage $V_{BL6}$ 1022 upstream toward the transistor 942. The transistor 943 is turned on by setting the word line voltage $V_{WL32}$ 1011 to a Vpass voltage and applying the Vpass voltage to the word line 913. Given that the word line 913 has not been selected, the Vpass voltage serves to turn on a transistor device to pass a bit line voltage. At the same time, the un-selected word line does not require the application of as high a voltage for the selected word line 912. The sixth bit line voltage $V_{BL6}$ 1022 of 5 volts propagates upward through the transistor 944, through the transistor 943, and to the left trap site 942b in the transistor 942. The combination of the voltage $V_{WL16}$ 1010 supplying +8 volts to the word line 912, and the sixth bit line voltage $V_{BL6}$ 1022 supplying 5 volts to the sixth bit line 925, generates and causes holes 984 to move into the left bit site 942b in the transistor 942.

The transistor 937, connected to the word line 962, has not been selected for programming in this example. When a transistor is not selected for programming, a respective bit line does not apply any voltage to a junction of a transistor. The fifth bit line voltage $V_{BL5}$ 1021, connected to the fifth bit line 924, has about 0 volts.

Figure 11:
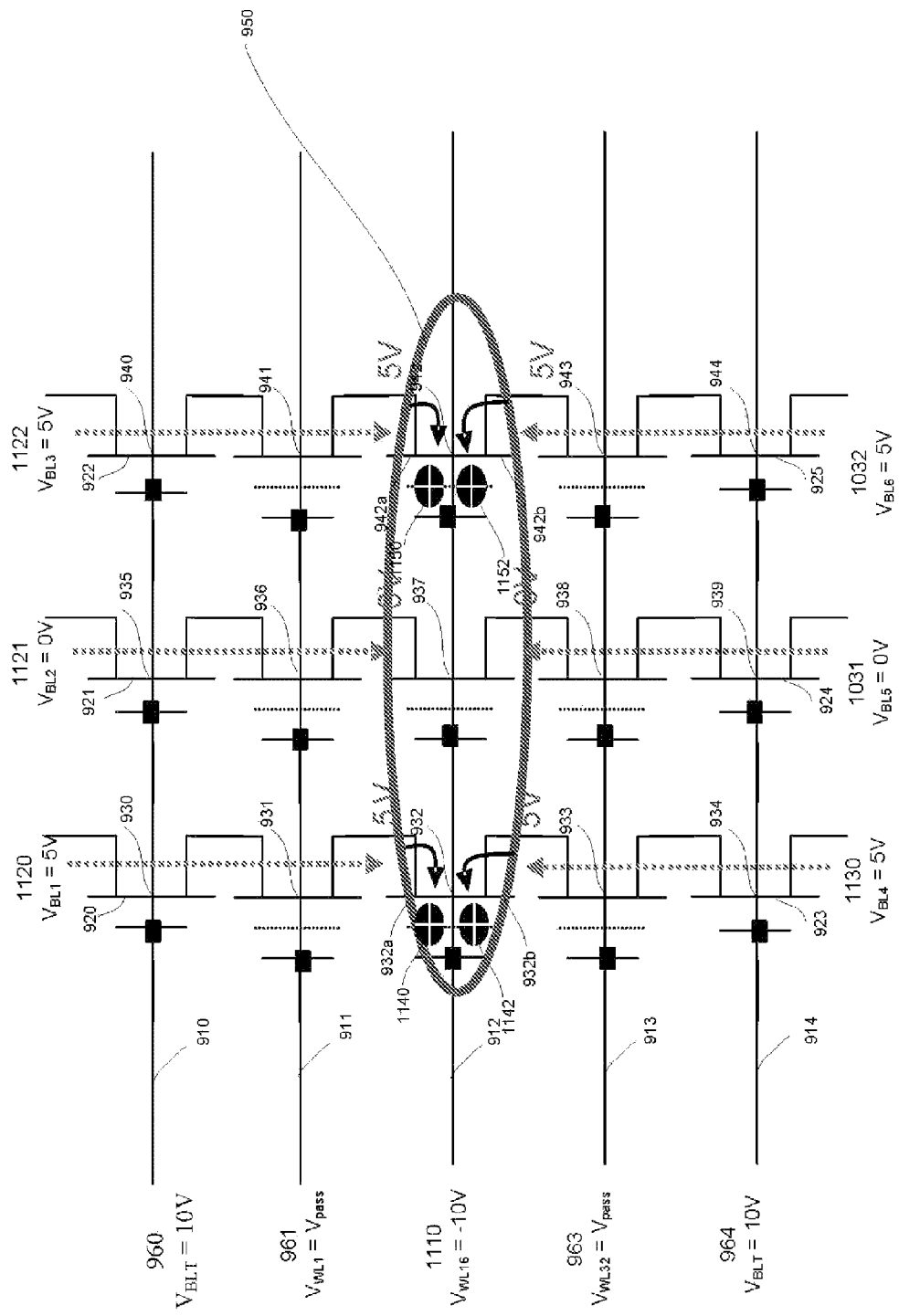
FIG. 11 is a circuit diagram illustrating a third embodiment of a method for erasing a NAND array by erasing with double-side-bias hole injection in accordance with the present invention.

FIG. 11 is a circuit diagram of the NAND memory structure 900 illustrating a third method embodiment in which a DSB-HI technique is applied to selected word lines for a selective or random erasing operation. The double-side-bias hole injection, in erasing the NAND array structure 900, is also conducted based on random (or selective) erasing, which means that an erase operation can be carried out on a bit-by-bit basis, instead of a block erase. In this illustration, the transistors 932 and 942 are selected for erase using the double-side-bias hole injection method. To conduct the double-side-bias hole injection method, a negative word line voltage 1010, $V_{WL16}$, is applied to the word line 912, which is connected commonly to gate terminals of the transistors 932, 937, 942. One exemplary voltage of the negative voltage applied to the word line 912 is about −10 volts.

To erase the right trap site (or first or top junction) 932a in the transistor 932, a first bit line voltage $V_{BL1}$ 1120 is applied to the first bit line 920. The transistor 930 is turned on by applying the voltage $V_{BLT}$ 960 to the word line 910 in order to pass the first bit line voltage $V_{BL1}$ 1120 downstream toward the transistor 932. The transistor 931 is turned on by setting the word line voltage $V_{WL1}$ 961 to a Vpass voltage and applying the Vpass voltage to the word line 911. The Vpass voltage is a voltage that is greater than a program voltage and sufficient to turn on a transistor. Given that the word line 911 has not been selected (or is an un-selected word line), the Vpass voltage serves to turn on a transistor device to pass a bit line voltage. At the same time, the un-selected word line does not require the application of as high a voltage, such as 10 volts, for the selected word line 912. The first bit line voltage $V_{BL1}$ 1120 of 5 volts propagates downward through the transistor 930, through the transistor 931, and to the first junction 932a (source or drain) in the transistor 932. The combination of the voltage $V_{WL16}$ 1110 supplying −10 volts to the word line 912, and the first bit line voltage $V_{BL1}$ 1120 supplying 5 volts to the first bit line 920, generates and causes holes 1140 to move into the first junction 932a in the transistor 932.

A fourth bit line voltage $V_{BL4}$ 1130 is applied to the fourth bit line 923 to erase the right trap site (or second junction or a bottom junction) 932b in the transistor 932. The transistor 934 is turned on by applying the voltage $V_{BLT}$ 964 to the word line 914 in order to pass the fourth bit line voltage $V_{BL4}$ 973 upstream toward the transistor 932. The transistor 933 is turned on by setting the word line voltage $V_{WL32}$ 963 to a Vpass voltage and applying the Vpass voltage to the word line 913. The fourth bit line voltage $V_{BL4}$ 973 of 5 volts propagates upward through the transistor 934, through the transistor 933 and to the second junction 932b (source or drain) in the transistor 932. Therefore, the DSB-HI erasing method has been conducted by simultaneously programming the first junction 932a in the transistor 932 with the first bit line voltage $V_{BL1}$ 1120 and the second junction 932b with the fourth bit line voltage $V_{BL4}$ 1130 in the transistor 932. The first bit line voltage $V_{BL1}$ 1120 of 5 volts propagates downward through the transistor 930, the transistor 931, and to the first junction 932a in the transistor 932. The combination of the voltage $V_{WL16}$ 1110 supplying −10 volts to the word line 912, and the fourth bit line voltage $V_{BL4}$ 1130 supplying 5 volts to the fourth bit line 923, generates and causes holes 1142 to move into the right trap site junction 932b in the transistor 932.

Figure 12:
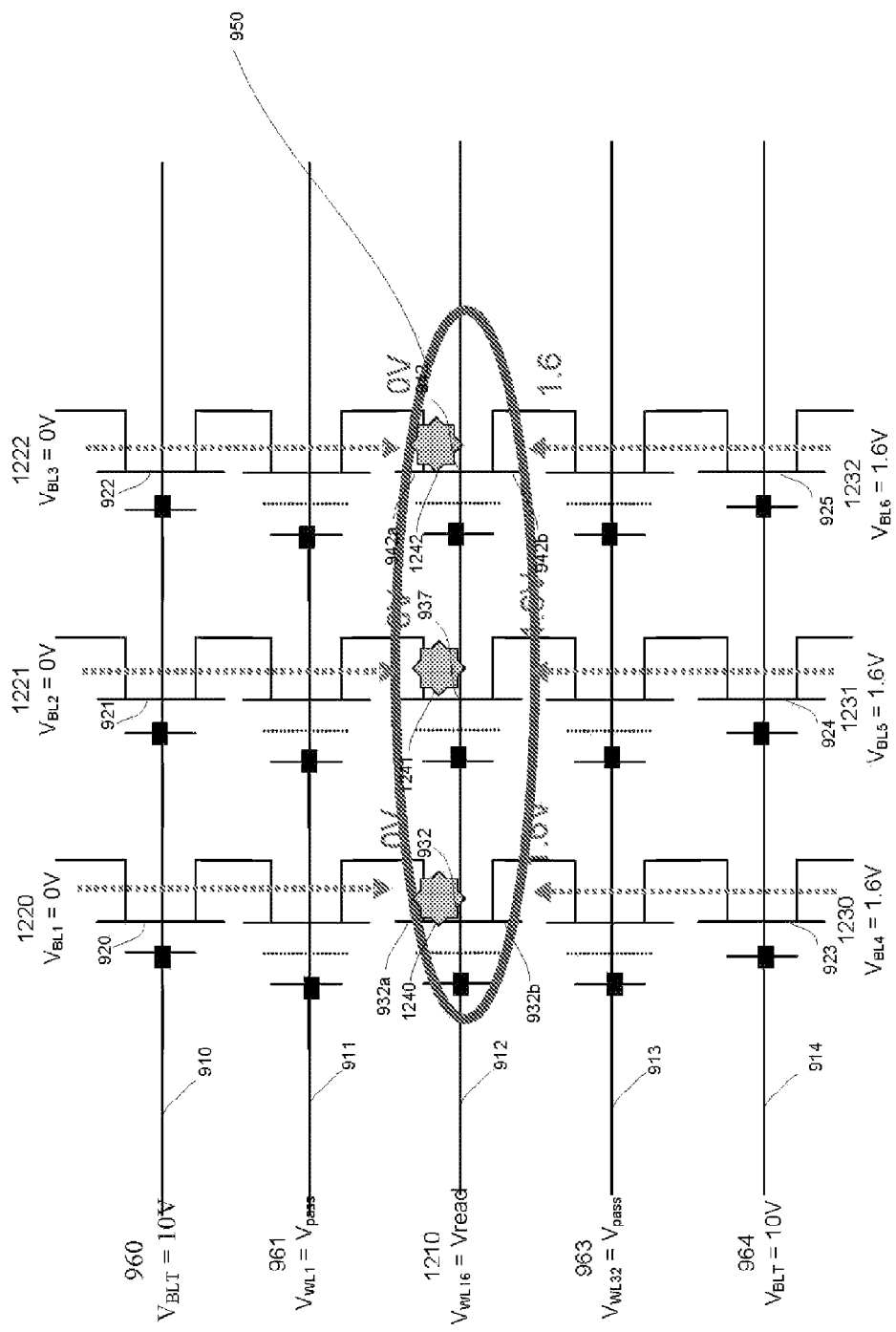
FIG. 12 is a circuit diagram illustrating a one-bit cell read operation of one or more right bits in the NAND memory in accordance with the present invention.

FIG. 12 is a circuit diagram of the NAND memory structure 900 for carrying out a one-bit cell read operation of a right bit (or a bottom bit-line-transistor) in one more selected memory devices. The read voltage 1210 is selected from an erase voltage and a program voltage. The voltage $V_{WL16}$ 1210 supplies the read voltage to the word line 912 that is connected to the transistors 932, 937 and 942. A differential voltage of 1.6 volts between drain and source regions in the transistor 932 is created by applying a first bit line voltage $V_{BL1}$ 1220 of 0 volts to the first line bit 920 and applying a fourth bit line voltage $V_{BL4}$ 1230 of 1.6 volts to the fourth bit line 923. Similarly, a differential voltage of 1.6 volts between drain and source regions in the transistor 937 is created by applying a second bit line voltage $V_{BL2}$ 1211 of 0 volts to the second line bit 921 and applying the fifth bit line voltage $V_{BL5}$ 1231 of 1.6 volts to the fifth bit line 924. Furthermore, a differential voltage of 1.6 volts between drain and source regions in the transistor 942 is created by applying a third bit line voltage $V_{BL3}$ 1222 to the third line bit 922 and applying the sixth bit line voltage $V_{BL6}$ 1232 of 1.6 volts to the sixth bit line 925. Word line voltages $V_{WL1}$ 961 and $V_{WL32}$ 963 supply a Vpass voltage to word lines 911, 913, respectively, without read disturbances. The Vpass voltage is selected to be a voltage value greater than a program voltage in order to turn on a transistor device.

Figure 13:
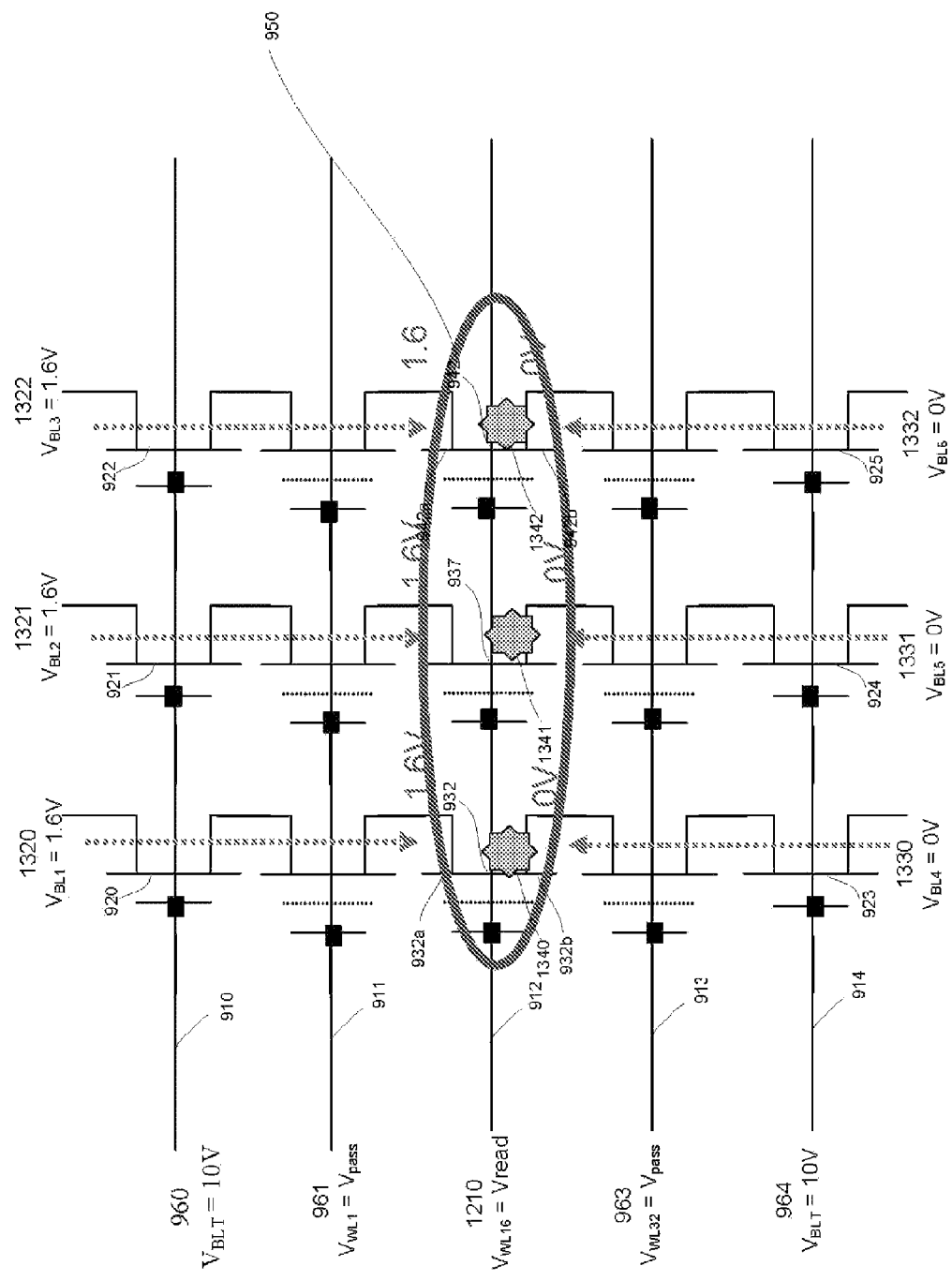
FIG. 13 is a circuit diagram illustrating a one-bit cell read operation of one or more left bits in the NAND memory in accordance with the present invention.

FIG. 13 is a circuit diagram of the NAND memory structure 900 in carrying out a one-bit cell read operation of a left bit (or a top bit bit-line transistor) in one or more selected memory cells in the NAND memory structure 900]. The voltage $V_{WL16}$ 1210 supplies the read voltage to the word line 912 that is connected to the transistors 932, 937 and 942. A differential voltage of 1.6 volts between drain and source regions in the transistor 932 is created by applying a first bit line voltage $V_{BL1}$ 1320 of 1.6 volts to the first line bit 920 and applying the fourth bit line voltage $V_{BL4}$ 1330 of 0 volts to the fourth bit line 923. Similarly, a differential voltage of 1.6 volts between drain and source regions in the transistor 937 is created by applying a second bit line voltage $V_{BL2}$ 1321 of 1.6 volts to the second line bit 921 and applying the fifth bit line voltage $V_{BL5}$ 1331 of 0 volts to the fifth bit line 924. Furthermore, a differential voltage of 1.6 volts between drain and source regions in the transistor 542 is created by applying a third bit line voltage $V_{BL3}$ 1322 to the third line bit 922 and applying the sixth bit line voltage $V_{BL6}$ 1332 of 0 volts to the sixth bit line 925. Word line voltages $V_{WL1}$ 961 and $V_{WL32}$ 963 supply a Vpass voltage to word lines 911, 913, respectively, without read disturbances. The Vpass voltage is selected to be a voltage value greater than a program voltage in order to turn on a transistor device.

The invention has been described with reference to specific exemplary embodiments. Accordingly, the specification and drawings are to be regarded as illustrative of the principles of this invention rather than restrictive, the invention is defined by the following appended claims.

I claim:

1. A method for double-side-biasing (DSB) a NAND memory device having a matrix of charge trapping memory cells in a memory array, each charge trapping memory cell having a first charge trapping site for storing a first bit and a second charge trapping site for storing a second bit, the matrix of charge trapping memory cells connecting to a plurality of word lines in row directions and a plurality of bit lines in column directions, comprising:

electron-injection programming the one or more selected charge trapping memory cells in the matrix of charge trapping memory by simultaneously biasing a respective source terminal and a respective drain terminal in each of the plurality of charge trapping memory cells and applying a positive gate voltage to a select word line connecting to the plurality of charge trapping memory cells; and hole-injection erasing the one or more selected charge trapping memory cells in the matrix of charge trapping memory by simultaneously biasing a respective source terminal and a respective drain terminal in each of the plurality of charge trapping memory cells and applying a negative gate voltage to the select word line connecting to the plurality of charge trapping memory cells.

2. The method of claim 1, during the programming step, wherein a pass voltage is applied to un-selected word lines in the plurality of word lines, the pass voltage having a voltage value greater than programming voltage.

3. The method of claim 1, during the erasing step, wherein a pass voltage is applied to un-selected word lines in the plurality of word lines, the pass voltage having a voltage value greater than programming voltage.

4. The method of claim 1, wherein the positive gate voltage applied to the selected word line during the programming step is about +10 volts.

5. The method of claim 1, wherein the negative gate voltage applied to the selected word line during the erasing step is about −10 volts.

6. A method for double-side-biasing (DSB) a NAND memory device having a matrix of charge trapping memory cells in a memory array, each charge trapping memory cell having a first charge trapping site for storing a first bit and a second charge trapping site for storing a second bit, the matrix of charge trapping memory cells connecting to a plurality of word lines in row directions and plurality of bit lines in column directions, comprising:

FN programming a plurality of charge trapping memory cells in the matrix of charge trapping memory by simultaneously biasing a respective source terminal and a respective drain terminal in each of the plurality of charge trapping memory cells and applying a positive gate voltage to a select word line connecting to the plurality of charge trapping memory cells; and hole-injection erasing the one or more selected charge trapping memory cells in the matrix of charge trapping memory by simultaneously biasing a respective source terminal and a respective drain terminal in each of the plurality of charge trapping memory cells and applying a negative gate voltage to the select word line connecting to the plurality of charge trapping memory cells.

7. The method of claim 1, during the programming step, wherein a pass voltage is applied to un-selected word lines in the plurality of word lines, the pass voltage having a voltage value greater than programming voltage.

8. The method of claim 1, during the erasing step, wherein a pass voltage is applied to un-selected word lines in the plurality of word lines, the pass voltage having a voltage value greater than programming voltage.

9. The method of claim 1, wherein the positive gate voltage applied to the selected word line during the programming step is about +20 volts.

10. The method of claim 1, wherein the negative gate voltage applied to the selected word line during the erasing step is about −10 volts.

11. A method for double-side-biasing (DSB) a NAND memory device having a matrix of charge trapping memory cells in a memory array, each charge trapping memory cell having a first charge trapping site for storing a first bit and a second charge trapping site for storing a second bit, the matrix of charge trapping memory cells connecting to a plurality of word lines in row directions and a plurality of bit lines in column directions, comprising:

channel hot electron programming of a first bit in the first charge trapping site for each charge trapping memory cell in a plurality of charge trapping memory cells in the matrix of charge trapping memory by simultaneously biasing a respective source terminal and a respective drain terminal in each of the plurality of charge trapping memory cells and applying a positive gate voltage to a select word line connecting to the plurality of charge trapping memory cells;

channel hot electron programming of a second bit in the second charge trapping site for each charge trapping memory cell in a plurality of charge trapping memory cells in the matrix of charge trapping memory by simultaneously biasing a respective source terminal and a respective drain terminal in each of the plurality of charge trapping memory cells and applying a positive gate voltage to a select word line connecting to the plurality of charge trapping memory cells; and hole-injection erasing the one or more selected charge trapping memory cells in the matrix of charge trapping memory by simultaneously biasing a respective source terminal and a respective drain terminal in each of the plurality of charge trapping memory cells and applying a negative gate voltage to the select word line connecting to the plurality of charge trapping memory cells.

12. The method of claim 11, during the channel hot electron programming step of the first bit, wherein a pass voltage is applied to un-selected word lines in the plurality of word lines, the pass voltage having a voltage value greater than programming voltage.

13. The method of claim 11, during the channel hot electron programming step of the second bit, wherein a pass voltage is applied to un-selected word lines in the plurality of word lines, the pass voltage having a voltage value greater than programming voltage.

14. The method of claim 11, during the channel hot electron programming step of the first bit, wherein the positive gate voltage applied to the selected word line during the programming step is about +10 volts.

15. The method of claim 11, during the channel hot electron programming step of the second bit, wherein the positive gate voltage applied to the selected word line during the programming step is about +10 volts.

16. The method of claim 11, wherein the negative gate voltage applied to the selected word line during the erasing step is about −10 volts.

17. The method of claim 11, further comprising reading the first bit in the first charge trapping site for each selected memory cell in the plurality of charge trapping memory cells.

18. The method of claim 11, further comprising reading the second bit in the second charge trapping site for selected memory cells in the plurality of charge trapping memory cells.

* * * * *